United States Patent [19]

Cipolla

[11] Patent Number: 5,102,290
[45] Date of Patent: Apr. 7, 1992

[54] TRANSFER DEVICE

[75] Inventor: Thomas M. Cipolla, Hopewell Junction, N.Y.

[73] Assignee: International Business Machines Corporation, Armonk, N.Y.

[21] Appl. No.: 626,339

[22] Filed: Dec. 13, 1990

Related U.S. Application Data

[63] Continuation of Ser. No. 278,063, Nov. 30, 1988, abandoned.

[51] Int. Cl.⁵ .............................................. B25J 18/00
[52] U.S. Cl. .................................. 414/752; 74/89.17; 901/25; 901/40; 901/41; 414/786
[58] Field of Search ............... 414/737, 751, 752, 786; 198/375, 379, 474.1, 468.2, 468.4; 74/89.17, 89.18, 89.19, 422, 31; 901/25, 40, 41

[56] References Cited

U.S. PATENT DOCUMENTS

| | | | |
|---|---|---|---|
| 4,400,985 | 8/1983 | Bond | 74/103 |
| 4,419,041 | 12/1983 | Rose | 901/25 X |
| 4,634,338 | 1/1987 | Tsuge et al. | 198/468.2 X |
| 4,666,364 | 5/1987 | Doege et al. | 414/917 X |
| 4,899,606 | 2/1990 | Harris | 74/89.17 |

FOREIGN PATENT DOCUMENTS

2125307 9/1972 France .

Primary Examiner—Robert J. Spar
Assistant Examiner—Donald W. Underwood
Attorney, Agent, or Firm—Daniel P. Morris

[57] ABSTRACT

Apparatus for transferring a workpiece from a first predetermined location to a second predetermined location. Workpiece is transferred using one continuous motion, wherein the workpiece is transported through space in a trochoid arc. This is achieved by having a pickup arm mounted to a body having a cylindrical surface which rolls along a second surface. Pickup arm picks up the workpiece in a first predetermined location of the body and deposits the workpiece at a second predetermined location of the body.

7 Claims, 8 Drawing Sheets

TRANSFER DEVICE

This is a continuation of application Ser. No. 07/278,063, filed Nov. 30, 1988, now abandoned.

FIELD OF THE INVENTION

This invention relates to a workpiece transfer device, more particularly, a device for transferring an integrated circuit electronic device from a first position to a second position for use in an apparatus for bonding the electronic device to electrically conductive elements.

BACKGROUND OF THE INVENTION

Transferring parts or workpieces in an automatic assembly machine generally requires three motions: a vertical upward motion to lift the part out of a storage device such as a hopper or magazine, a horizontal motion to move the part to another location on the machine, and another vertical but downward motion to place the part into an assembly or another station on the machine that does subsequent operations on the part. There are two independent directions of motion, a vertical motion and a horizontal motion. These two motions necessitate a control device to control the two independent motions and to sequence them properly in an automated machine. The sequencing operation very often necessitates sensing devices during the transfer to insure one of the three motions has taken place and is completed before the subsequent motion is initiated. The device described herein uses only one motion to accomplish this transfer. The need for three motions is eliminated by using a single curved motion that approximates an upward, then horizontal, then downward motion. The motion is generated kinamaticly using a sliding device and a set of gears. The elimination of one of the two independent motions, vertical and horizontal, of the prior art machines reduces the time for making a transfer of a workpiece from a first location to a second location, thereby increasing the speed of operation. Moreover, since only one motion is needed there is a reduction in the computer controlled operations for the transfer. These combine to reduce the cost and complexity of the workpiece transfer operation. Furthermore, and very significantly, a single motion transfer eliminates all of the complexity of synchronizing the two independent motions, the horizontal and the vertical, of the prior art devices.

The present invention has been found to be particularly useful for high speed manufacture of integrated circuit electronic components. In particular, the apparatus of the present invention can be used to pick up a semiconductor chip from a storage location and to transfer it to a bondhead which is used to bond contact locations on the semiconductor chip to the plurality of beam leads for electrically connecting the semiconductor chip to an electronic packaging substrate.

It is an object of this invention to provide an apparatus for transferring a workpiece from a first location to a second location along a substantially smooth curved motion.

It is another object of this invention to provide an apparatus to vertically pickup, to horizontally transfer and to vertically deposit a workpiece using one motion.

It is another object of this invention to provide an apparatus to deposit a workpiece at a location with substantially no vertical speed at the deposit location.

It is another object of this invention, transfer a workpiece from a first location to a second location along a trochoid like curve.

It is another object of this invention to achieve the trochoid transfer motion by rolling a cylindrical shaped member along a surface, wherein there is a workpiece pickup arm projecting along a direction parallel to the cylindrical surface.

SUMMARY OF THE INVENTION

In its broadest aspect this invention is an apparatus for transferring a workpiece from a first predetermined location to a second predetermined location through a substantially continuously curved arc from the first location to the second location.

In a more particular aspect of this invention, the apparatus has a frame, a surface on the frame, a member having a substantially cylindrical surface which is adapted for rolling along the surface.

There is a workpiece pickup means attached to the member. There is a means for causing the cylindrical surface to roll along the surface on the frame. This causes the pickup means to move along a curved arc from the first location to the second location.

In another more particular aspect of the present invention, the member with the substantially cylindrical surface is a spur on pinion gear and the surface along which it rolls on the frame is a rack gear.

In another more particular aspect of the present invention, the workpiece pickup means is an arm which projects outwardly from the plane of the spur gear, the pickup point on the arm being located at a distance from the axis of the spur gear substantially equal to the radius of the spur gear.

In another more particular aspect of the present invention, there is a vacuum pickup means at the tip of the workpiece pickup means.

In another more particular aspect of the present invention, one edge of the workpiece pickup means tip is at the intersection of the radius of the spur gear and the surface defined by the pitch diameter of the spur gear.

These and other objects, features and advantages will be apparent from the following more particular description of the preferred embodiments.

DETAILED DESCRIPTION OF THE PREFERRED EMBODIMENTS

Figure 1:
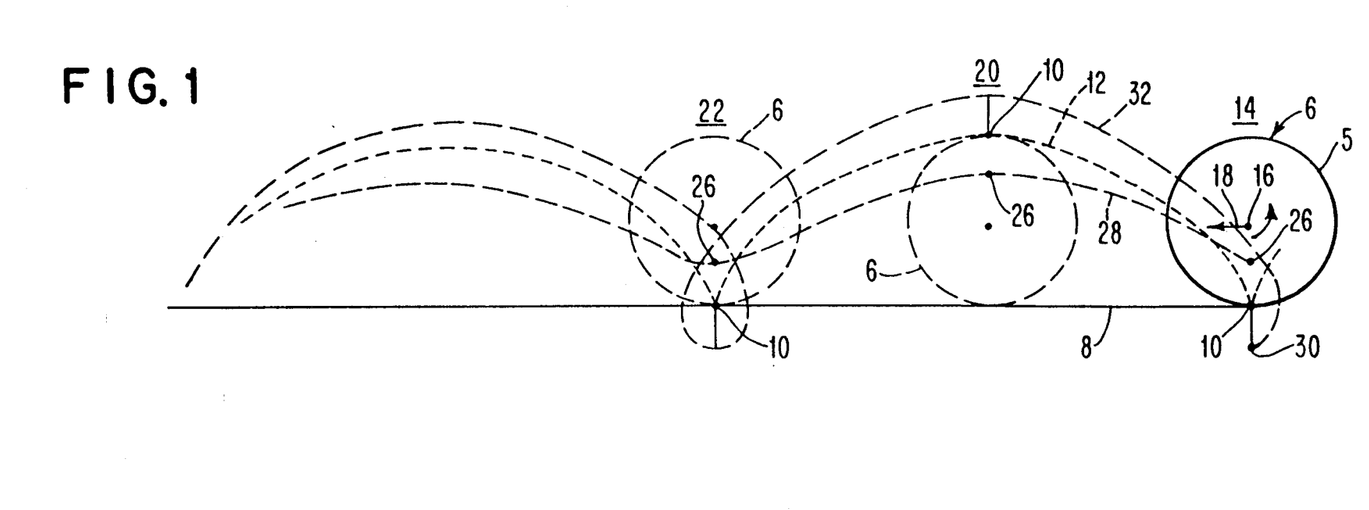
FIG. 1 shows the geometrical concept on which the present invention is based.

FIG. 1 shows the basic geometrical concept of the invention. When circle 6 rolls along flat surface 8, a point 10 on the circumference of the circle sweeps out an arc 12 in space known as a cycloid which is a particular type of trochoid. In position 14 of circle 6, point 10 is in contact with surface 8. As the center 16 of circle 6 moves in the direction of 18, circle 6 rotates counter-clockwise. Point 10 sweeps out arc 12 reaching a maximum elevation above surface 8 at location 20 of circle 6. At location 20 the center 16 of the circle 6 has traveled a distance equal to one half the circumference of the circle from location 14. As circle 6 continues to move in the direction 18, point 10 returns to a position in contact with surface 8 at position 22 of circle 6. At location 22 the center 16 of the circle 6 has traveled a distance equal to the circumference of the circle from location 14. The direction of motion of point 10 at positions 14 and 22 of circle 6 is vertical, that is straight up and down. The vertical velocity of point 10 at positions 14, 20 and 22 of circle 6 is zero. Point 10 touches surface 8 with no force in positions 14 and 22. Point 10 has a maximum acceleration along arc 12 in position 20 of circle 6. Point 26 on circle 6 which is along the same radius as point 10 but not on the circumference of circle 6 sweeps out arc 28 when moving from position 14 to position 22. Arc 28 is referred to as a curtate trochoid. Point 26 does not have a vertically up and down motion, as point 10, in positions 14 and 22 of circle 6. However, point 26 does have zero vertical velocity in positions 14, 20 and 22 of circle 6. Point 30 of circle 6 which is along an extension of the radius from center 16 to point 10 on the circumference of circle 6 sweeps out a curve referred to as a prolate trochoid arc 32. Arc 32 in positions 14, 20 and 22 of circle 6 has zero vertical velocity, but does not move straight up and down as point 10 does in positions 14 and 22. In positions 14 and 22, point 30 loops back and forth as shown in FIG. 1. Maximum acceleration of point 30 along arc 32 is in position 20 of circle 6. The maximum acceleration of point 26 along arc 28 is in position 20 of circle 6. For the purpose of this application arcs or curves 12, 28 and 32 are referred to as trochoids. The positions of points 10, 26 and 30 in location 14 and 22 of circle 6 are relative minima. The positions of these points in position 20 of circle 6 are relative maxima. The maxima and minima location are referred to as extrema.

In the preferred embodiment of this invention, a disk-like structure rolls along a planar surface such as 8 of FIG. 1. However, this invention is not limited to such motion. A disk-like structure can roll along a curved surface. In this case, points 10, 26 and 30 will sweep out continuous smooth curves which for the purpose of this application are included in the term trochoid. As described below in the preferred embodiment, a workpiece pickup means is positioned to be along the circumference of a disk or cylindrical structure. However, the workpiece pickup means can also be at any point along a radius of the circle 6 of FIG. 1. For a general surface 8, arcs 32 and 28 of FIG. 1 have a continuous first derivative and a continuous second derivative throughout the motion of circle 6. Arc 12 has a continuous first and second derivative except in positions 14 and 22 of circle 6 when point 10 is in contact with surface 8. At these locations, arc 12 has a continuous second derivative but a discontinuous first derivative. The first derivative to the right of the point of contact of point 10 with surface 8 is positive infinity. The first derivative just to the left of the point of contact of point 10 with surface 8 is negative infinity. This corresponds to point 10 going vertically up and down at the point of contact of point 10 with surface 8.

Figure 2:
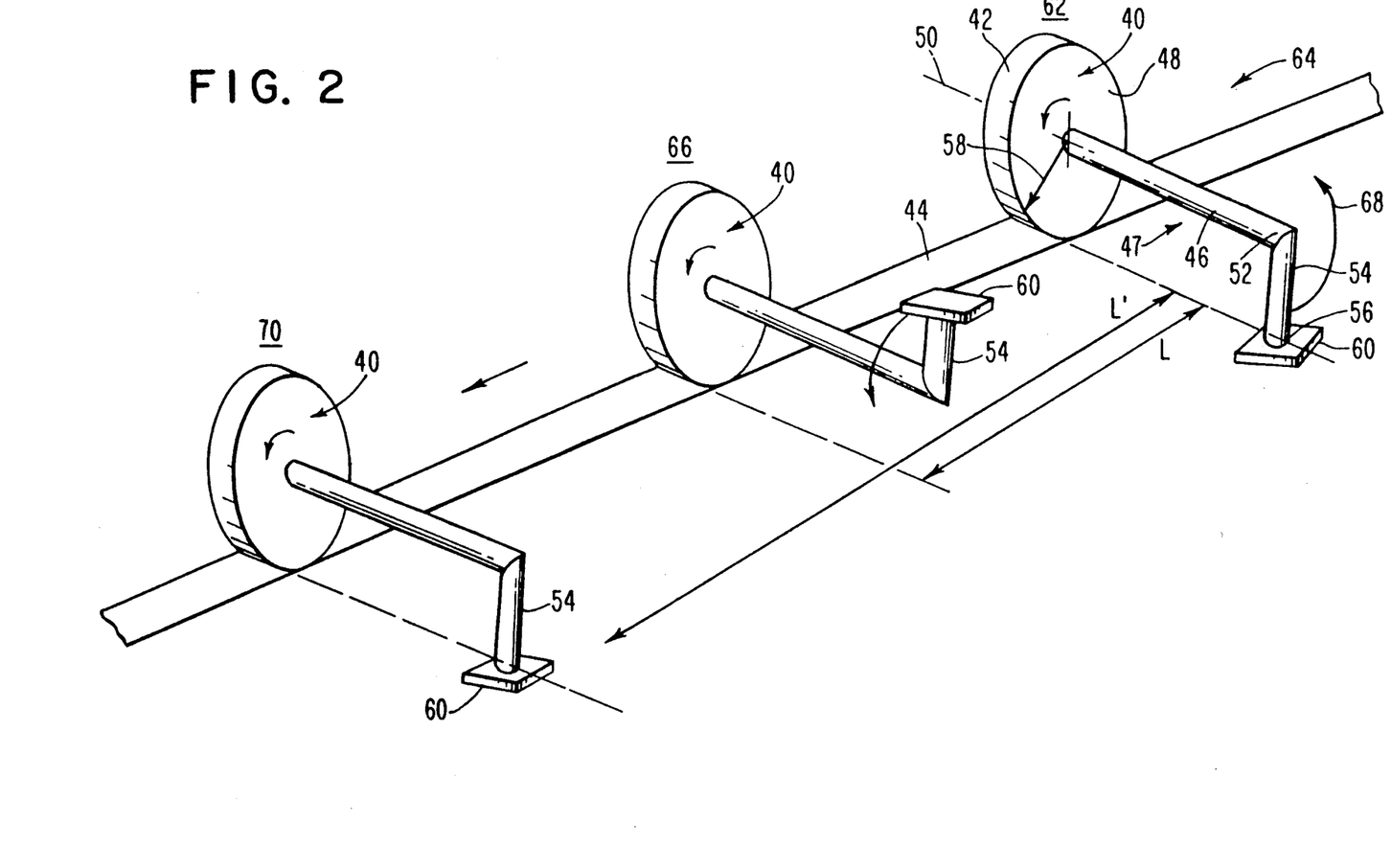
FIG. 2 diagramatically shows the basic concept of the apparatus according to the present invention.

FIG. 2 diagrammatically shows the basic concept of the apparatus according to the present invention. Member 40 has a substantially cylindrical surface 42 which rolls along surface 44. The pickup arm 47 is formed from member 46 and member 54. Member 46 is attached to surface 48 of member 40. Member 46 is shown extending perpendicularly from planar surface 48 along axis 50 of cylindrical surface 42. In the preferred embodiment described herein and below pickup arm is attached to member 40 in this way. However, the pickup arm can be attached to surface 48 of member 40 at any point on surface 40. Moreover member 40 does not have to have a planar surface 48 and the pickup arm does not have to be perpendicular to such a surface.

In the preferred embodiment to the end 52 of member 46 which is not attached to surface 48 there is member 54 which extends perpendicularly away from end 52 of member 46. End 56 of member 54 in the preferred embodiment is at a distance away from axis 50 of cylindrical surface 42 equal to the radius 58 of cylindrical surface 42. At position 62 of member 40 pickup arm tip 56 picks up workpiece 60, for example, by a vacuum pickup which is commonly used in the art. The axis 50 of cylindrical surface 42 is moved in a direction 64 causing member 40 to roll to position 66. Pickup arm tip 56 sweeps an arc 68 in space and member 40 travels a distance L equal to ½ the circumference of cylindrical surface 42. Pickup arm member 54 rotates 180 degrees with respect to its position at location 62 of member 40 as shown at position 66 of member 40. At location 66 of member 40, workpiece 60 faces upwardly and can be picked up at this location by a fixture, not shown in FIG. 2, to pickup arm 54. The vacuum pickup is released from surface 56 to transfer workpiece 60 to the fixture. Member 40 can roll from position 66 to position 70 which is at a distance L' equal to the circumference of the cylindrical surface 42. At location 70 of member 40 pickup arm member 54 has made a 360 degree revolution with respect to its location at position 62 of member 40. At location 70 of member 40 workpiece 60 can be deposited at a fixture not shown in FIG. 2 by the release of the vacuum pickup in pickup arm 54. Although vacuum pickup is the preferred embodiment for the pickup means the apparatus of the present invention is not limited thereto. When member 40 rolls from position 66 to position 70 workpiece 60 travels through a trochoid arc in space. The pickup arm can pick up and release the workpiece at any point along arc 68.

Figure 3:
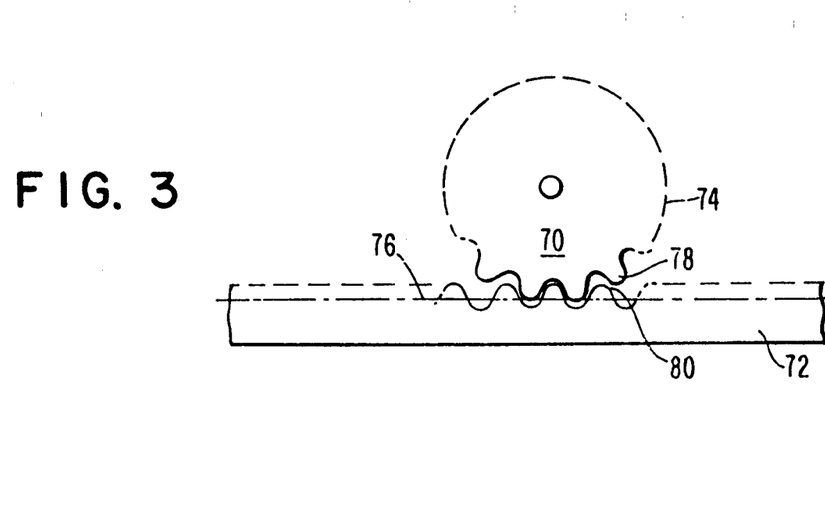
FIG. 3 shows a spur or pinion gear mounted to roll along a rack gear.

FIG. 3 shows the preferred embodiment of member 40 and surface 44 of FIG. 2. Member 40 of FIG. 2 is shown as spur or pinion gear 70. Surface 44 of FIG. 2 is shown in FIG. 3 as rack gear 72. Dashed line 74 along the perimeter of pinion gear 70 corresponds to the surface 42 of FIG. 2, that is, the cylindrical surface which rolls. Surface 74 is approximately at the mid-point between the peak and valley of the gear teeth of pinion gear 70. Surface 74 is known in the art as the circle formed by the pitch diameter. Surface 74 rolls along surface 76 of rack gear 72. Surface 76 is approximately midway between the peak and valley of the teeth of rack gear 72 and is known in the art as the line formed by the pitch diameter of the rack gear. The teeth 78 of pinion gear 70 mesh with the teeth 80 of rack gear. Even in the most ideal situations, there is a certain amount of free play or slop between the gear teeth on the pinion gear and the rack gear. As will be described herein and below, this slop is accounted for in the preferred embodiment of the present invention.

FIGS. 4-9 show the preferred embodiment of the apparatus of the present invention. All the numbers common between FIGS. 4-9 represent the same thing.

Figure 4:
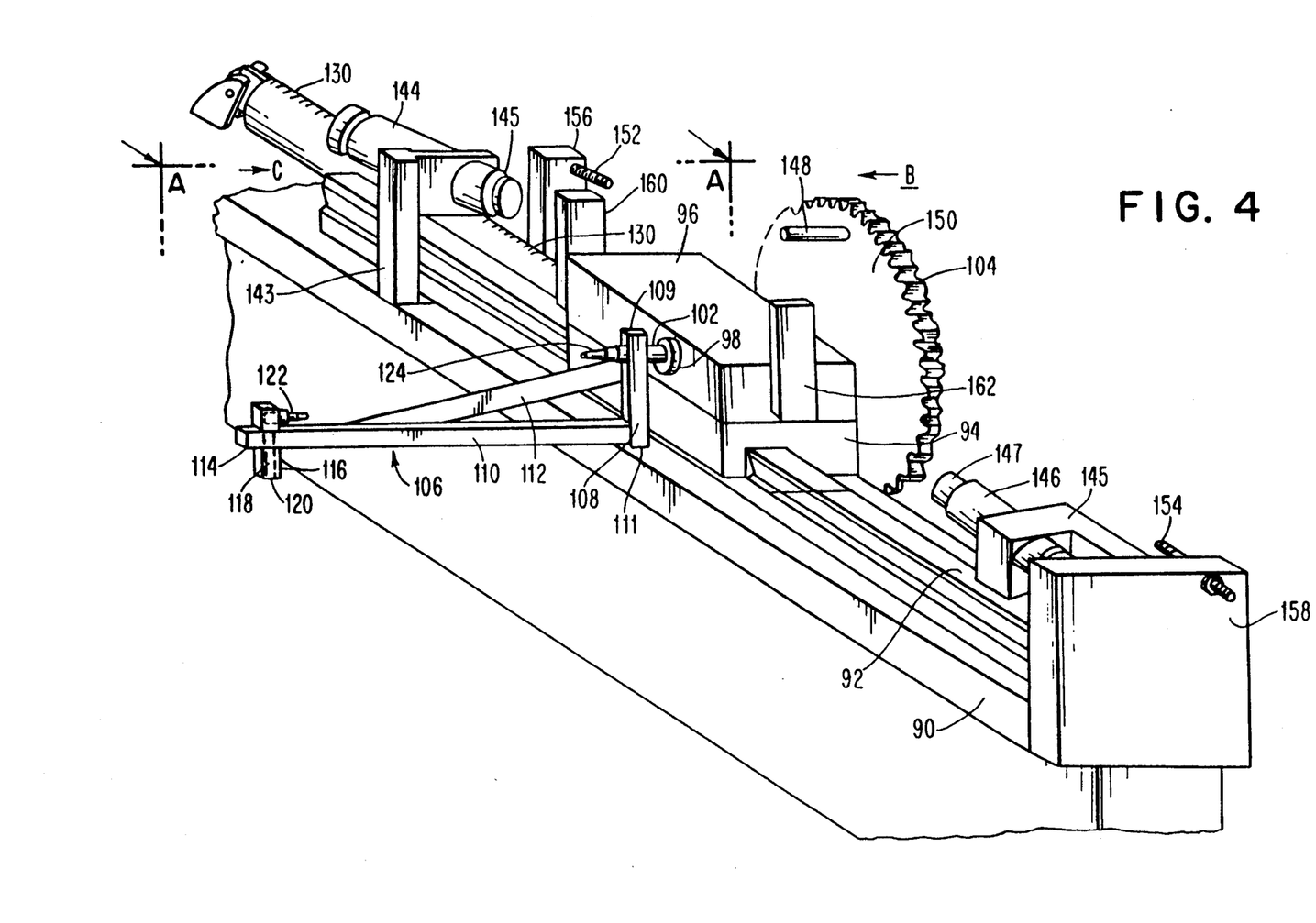
FIG. 4 shows a perspective view of the preferred embodiment of the present invention.

FIG. 4 is a perspective view of the apparatus according to the present invention.

Figure 5:
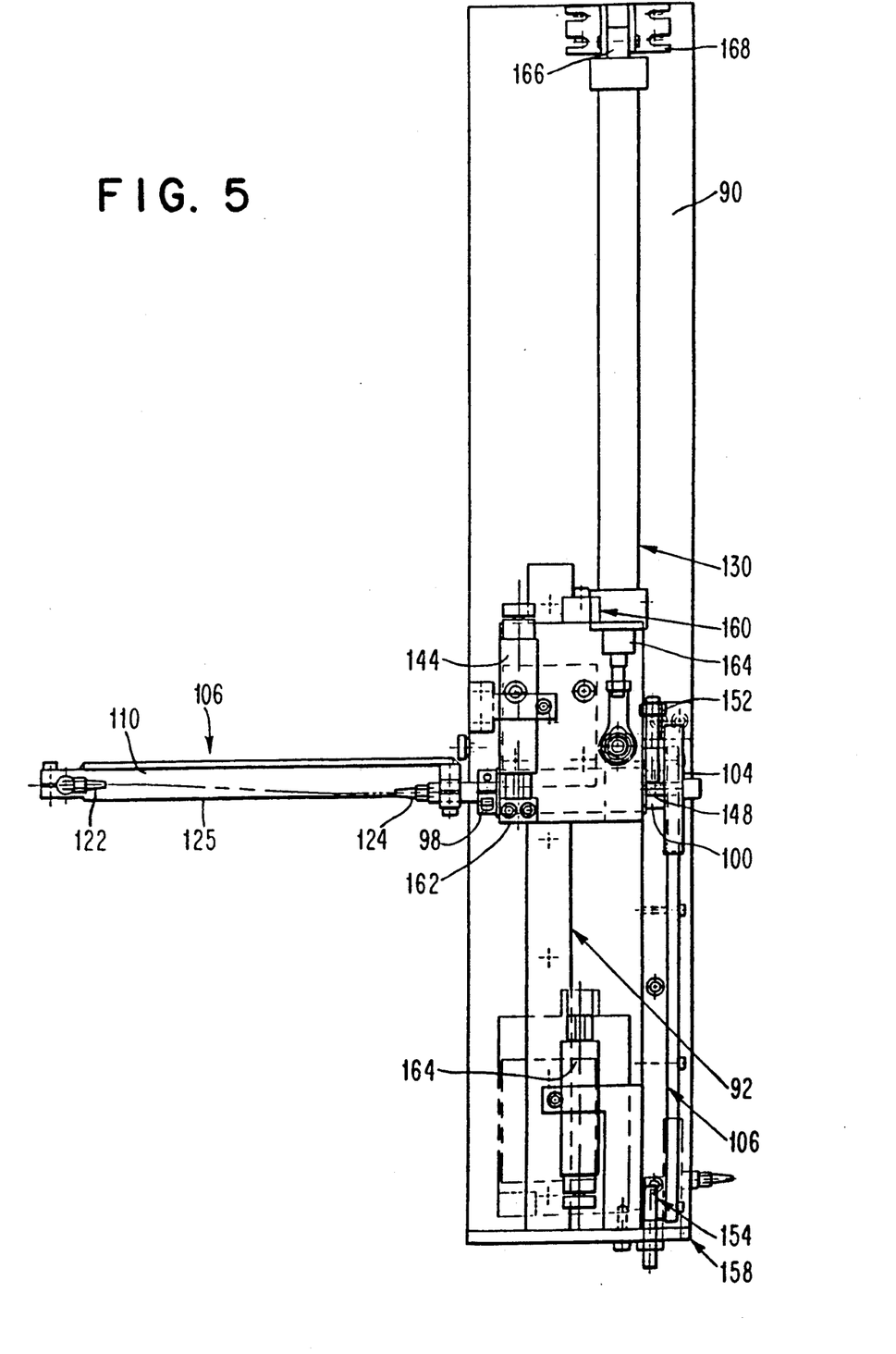
FIG. 5 shows a top plan view of the apparatus of FIG. 4.

FIG. 5 is a top view of the apparatus according to the present invention.

Figure 6:
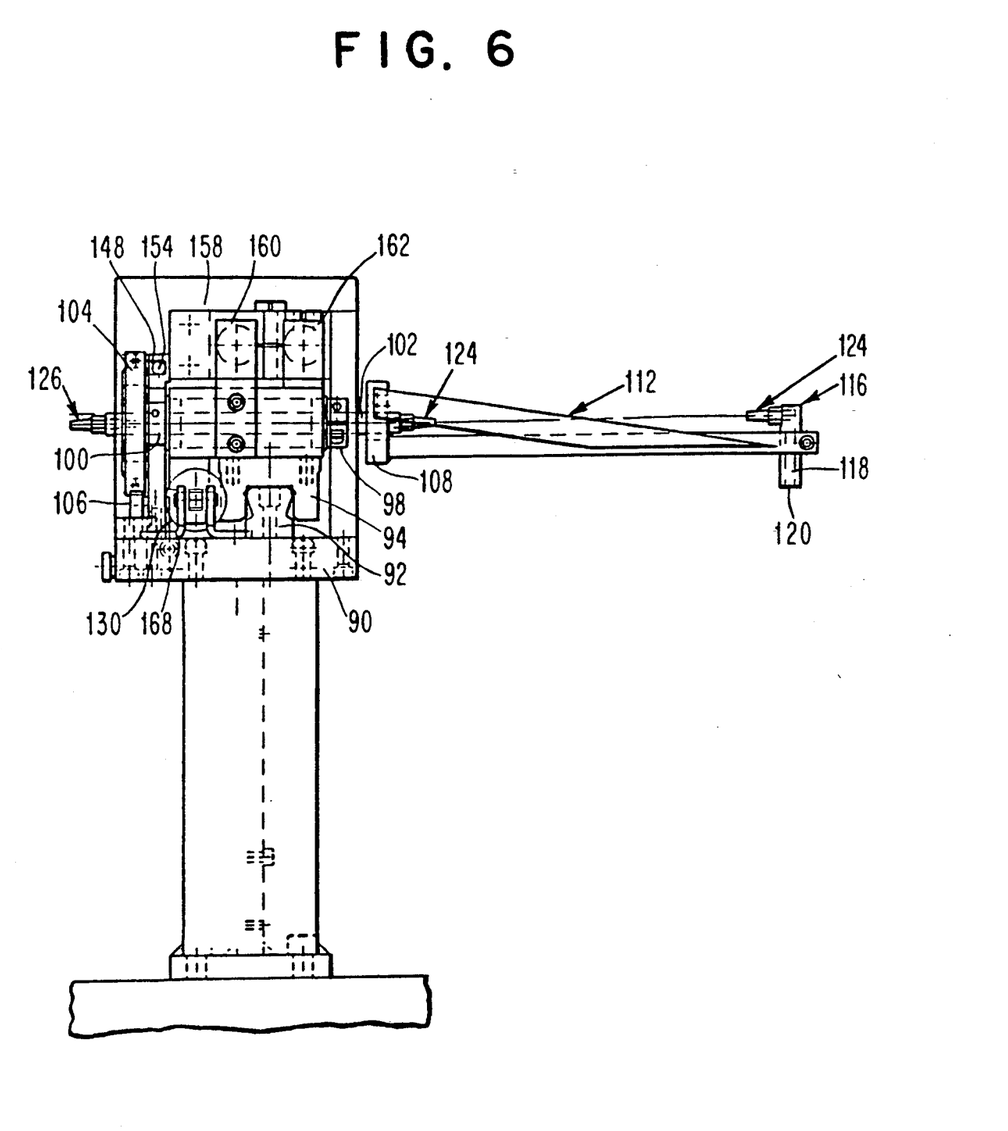
FIG. 6 shows a back plan view of the apparatus of FIG. 4 in the direction indicated by A in FIG. 4.

FIG. 6 is a cross-sectional view of the apparatus of the present invention along plane A of FIG. 4 in the direction indicated.

Figure 7:
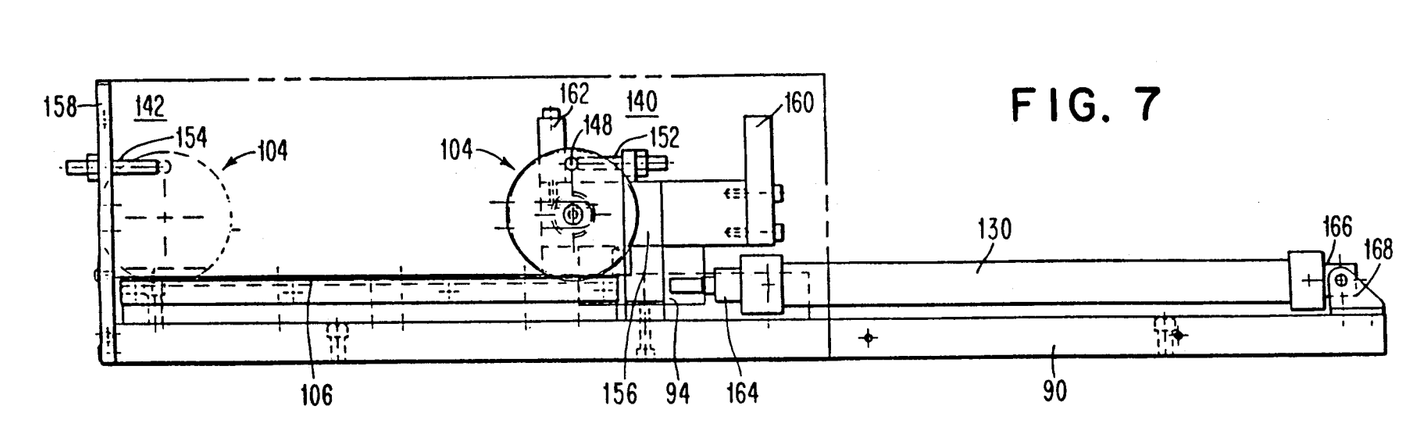
FIG. 7 shows a side plan view of the apparatus of FIG. 4 in the direction indicated by B in FIG. 4.

FIG. 7 is a side view of the apparatus according to the present invention in the direction indicated by arrow B of FIG. 4.

Figure 8:
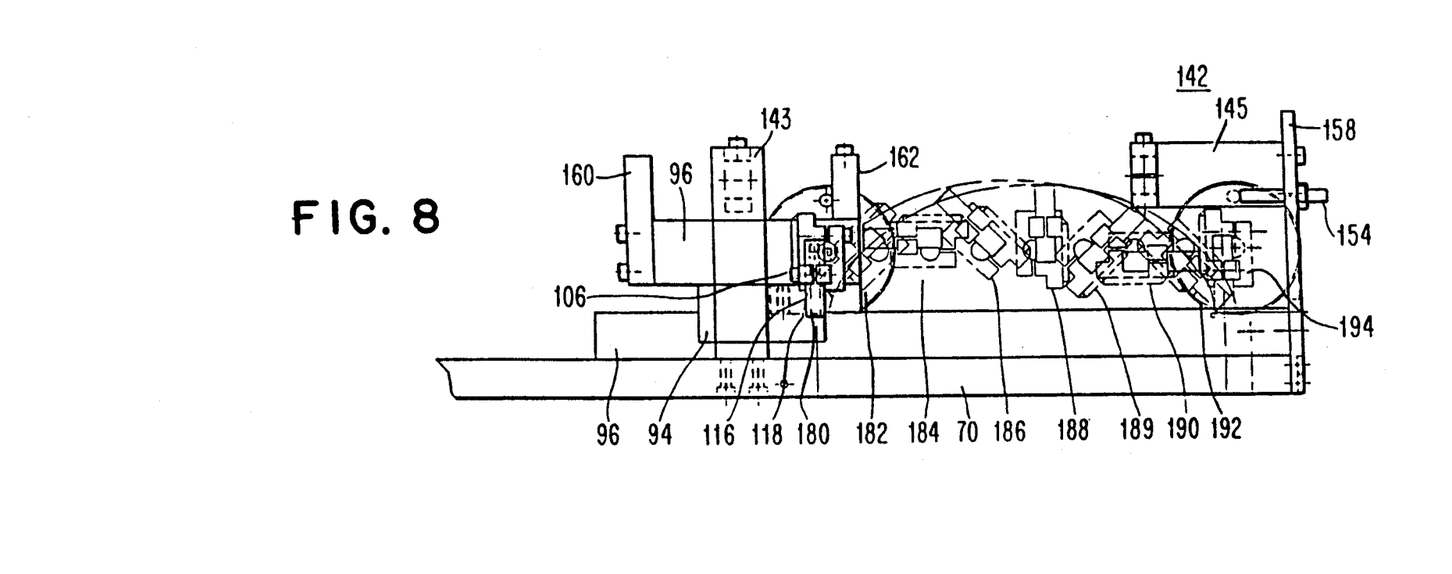
FIG. 8 is a side plan view of the apparatus of FIG. 4 in the direction indicated as 4 in FIG. 4 indicating various positions of the pickup means of the apparatus of FIG. 4 during transfer from a first to a second position.

FIG. 8 is a side view of the apparatus of FIG. 4 in the direction indicated by arrow C of FIG. 4 showing successive positions of the pickup arm during motion of the apparatus from a first position to a second position.

Figure 9:
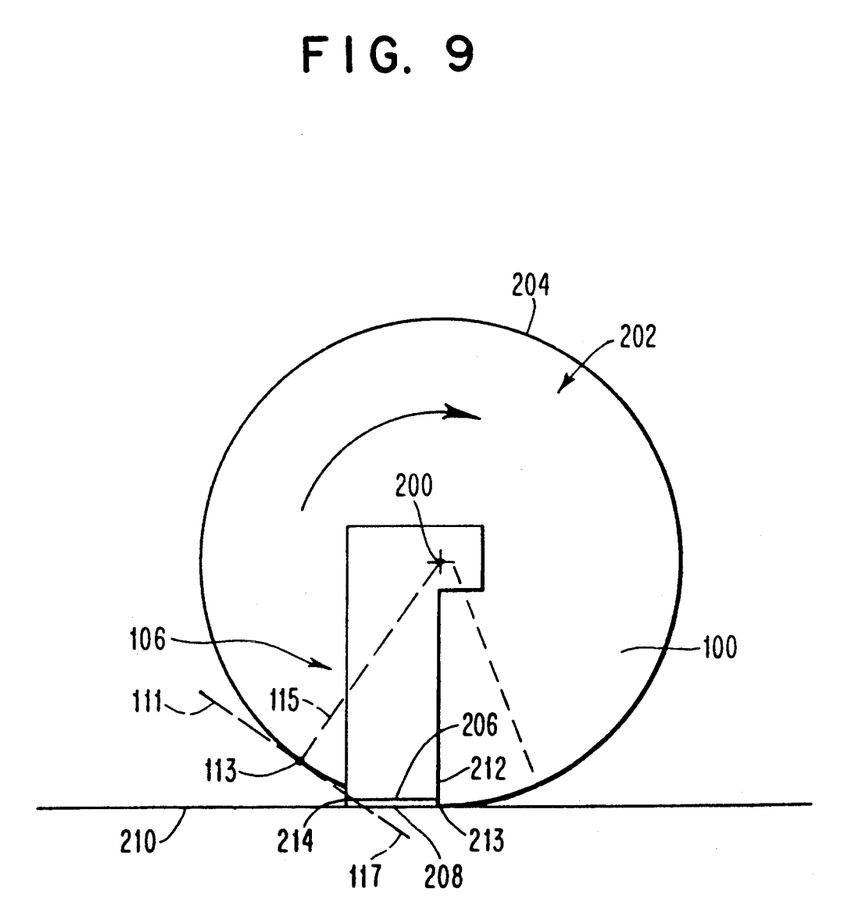
FIG. 9 is a diagrammatic view of the preferred orientation of the pickup arm tip surface with respect to the spur gear of the preferred embodiment of FIG. 4.

FIG. 9 shows diagrammatically the preferred embodiment of the relationship of the pickup arm to the pinion gear.

As shown in FIGS. 4-9 the preferred embodiment of the apparatus according to the present invention has a base plate 90 on which is mounted a commercially available e.g. model NSR20TBA1UU-340, manufactured by THK Inc. linear slide having stationary track 92 and movable carriage 94. A suitable bearing block 96, which a person of skill in the art can readily fabricate, is bolted to carriage 94. Bearing block 96 has affixed to it on opposite faces bearings 98 and 100. A rotatable shaft 102 is affixed through bearing block 96 and through bearings 98 and 100 permitting shaft 102 to rotate with respect to bearing block 96. At one end of shaft 102 is spur gear or pinion gear 104, that meshes with a stationary rack gear 106. The rack and pinion gears are commercially available, e.g. part numbers AG31 and DG80T60, manufactured by PIC DESIGN Corp. On the other end of rotatable shaft 102 is affixed an arm 106. Arm 106 is formed from a first member 108 having a first end 109 of which is attached in a perpendicular configuration with respect to rotatable shaft 102. Arm 106 has a second member 110 projecting from the opposite end 111 of arm 108 in a perpendicular direction away from bearing block 96. Arm 106 has a third member 112 which is attached at one end to arm member 108 near the connection of arm member 108 to rotable shaft 102. The second end of arm member 112 is connected to arm member 110 near the end of arm member 110 which is connected to arm member 108. Arm member 112 provides structural support for the attachment of arm member 108 to arm member 110. At end 114 of arm member 110, which is connected to arm member 108, there is a pickup tip 116. In the preferred embodiment pickup tip 116 extends in a perpendicular direction away from pickup arm 106 and 114. Pickup tip 116 has a cavity therein which extends to pickup surface 120. At the other end of cavity 118, there is a fitting 122 to which a hose is attached for applying vacuum to the pickup tip 116. The hose not shown in the figures connects fitting 122 to fitting 124 which is at the end of rotatable shaft 102 which projects through arm member 108 of pickup arm 106. Fitting 126 is on the end of shaft 102 which projects through spur gear 104. A vacuum hose is applied to fitting 126. Vacuum is supplied through hollow rotatable shaft 102 through fitting 124 through the hose connecting fitting 124 and 122. The vacuum is then applied through cavity 118 to an aperture on surface 120 which is used to pickup a workpiece. The vacuum supplied to surface 120 is turned on and off by use of a commonly used solenoid valve, for example, part number R481 manufactured by CLIPPARD MFG. Co.

Movable carriage 94 is moved from a first to a second position along slide track 92 by pneumatic cylinder 130. Pneumatic cylinders are commonly used in the art, for example, part number MRS-048-DXP manufactured by BIMBA MFG. Corp. In the preferred embodiment the workpiece picked up is a integrated circuit chip. Pneumatic cylinder 130 moves carriage 94 from a first position in which pickup tip 116 picks up the IC chip and then pneumatic cylinder 130 moves carriage 94 to a second position where pickup tip 116 deposits the chip by releasing the vacuum at surface 120. As carriage 94 moves from the first to the second position spur gear or pinion gear 104 rotates because it meshes with stationary rack gear 106. Shaft 102 attached to spur gear 104 rotates arm 106 which is attached to shaft 102 rotates. Picked up chip travels through space in a trochoid arc as described herein and above. Pneumatic cylinder 130 controlled by a second solenoid valve which controls the flow of a gas such as air into and out of the pneumatic cylinder to control the movement thereof. The solenoid valve controlling the movement of pneumatic cylinder 130 and controlling the vacuum pickup at pickup arm end 116 can be synchronized and controlled by a computer or other device in a manner commonly known in the art.

As shown in FIG. 7, pneumatic cylinder 130 moves carriage 94 from a first position 140 to a second position 142 shown in phantom in FIG. 7. As carriage 94 approaches positions 140 and 142, its motion is slowed down by shock absorber 144 at position 140 and shock absorber 146 at position 142. Shock absorbers 144 and 146 are commercially available, for example, part number OEM5B manufactured by ENIDINE. When carriage 94 is in position 140 tip 145 of shock absorber 144 presses against member 160 which is attached to carriage 94. When carriage 94 is in position 142 member 162 is pressed against tip 147 of shock absorber 146.

The motion of carriage 94 is stopped by pin 148 which is pressed fit into an aperture in the side 150 of spur gear 104. Pin 148 extends perpendicular to surface 150 of spur gear 104 and is directed towards pickup arm 106. When carriage 94 is in position 140, pin is 148 against adjustable stop 52. When carriage 94 is in position 142, pin 148 is against adjustable stop 154. Adjustable stops 152 and 154 are adjustable screws through member 156 and 158 respectively which are attached to base plate 90.

End 164 of pneumatic cylinder 130 is attached to carriage 94 and end 166 of pneumatic cylinder is attached to pivot bracket 168 which is attached to base plate 90.

FIG. 7 shows a side plan view of the apparatus of FIG. 4 in a direction indicated by arrow B in FIG. 4. FIG. 7 shows pinion 104 in a first position 140 and in a second position 142. Position 142 is shown in phantom. For the sake of clarity, all elements, e.g. shock absorbers 146 and 144, shown in FIG. 4 are not shown in FIG.

7. Pinion 104 and rack 106 are not shown with gear teeth. When pin 148 is pushed against stop 152 or 154, the gear teeth of the spur gear are pushed against the teeth of the rack gear 106, thereby avoiding any uncertainty in the position of the spur gear due to slop between the spur and rack gear teeth.

FIG. 8 shows a side view of the apparatus of FIG. 4 in a direction indicated by arrow C. All elements in FIG. 4 are not shown in FIG. 8 for the sake of clarity. When carriage 94 is in position 140 pickup arm tip 116 is facing down. Upon the application of a vacuum through aperture 118 in pickup arm end 116 an electronic device 180 is picked up. The vacuum is activated by a solenoid valve not shown. Another solenoid valve activates pneumatic cylinder 130 to push carriage 94 along track 92 to position 142. In FIG. 8 the position of pickup arm 106 is shown in phantom in positions 182, 184, 186, 188, 189, 190 and 192. It shows the pickup arm twisting in space, changing the orientation of electronic device 180. The electronic device is flipped into a face up position in position 188 of pickup arm 106. The electronic device is flipped over again in position 192. The electronic device or any other workpiece can be picked up at any point along transit path of the pickup arm. Also the electronic device can be deposited at any location along the transit path of the pickup arm. Typically, an electronic device will be picked up from a storage location holding the chips face up. Pickup arm picks the chip up and typically would stop at a position such as 180 to deposit the chip onto another apparatus such as a bondhead of a bonding tool. Vacuum in the bondhead tip 116 is released and a vacuum pickup would be activated in the bondhead picking the chip up. Another typical position in which the chip would be transported is that shown in location 194, wherein the chip is deposited in a face down configuration, for example, on a bondhead.

FIG. 9 diagrammatically shows the preferred orientation of the pickup arm 106 with respect to the center 200 of the member 202 having a cylindrical surface 204. In the apparatus of FIG. 4, the member having the cylindrical surface is the pinion or spur gear 104 and the cylindrical surface is the pitch diameter of the spur gear. The surface 206 of pickup arm 106 which picks up workpiece 208 from surface 210 has a forward edge 212 which is along a radius of cylindrical surface 204 to the point where forward edge 212 touches surface 210. As member 202 rotates about center 200 trailing edge 214 of surface 206 is lifted first off of surface 210. Workpiece 208 instantaneously rotates about point 213 which is the point of contact of forward edge 212 with surface 210. This configuration permits workpiece 208 to be peeled off of surface 210. If the leading edge 212 were not along a radius from the center 200 of cylindrical surface 202, as member 202 began to rotate the leading edge would be pushed into surface 210. Dashed line 111 illustrates this situation intersecting circle 204 at point 113 on radius 115. Dashed line 111 has a leading edge 117 which is not on a radius of the circle. Line 111 is shown in a rotated position with edge 117 below surface 210. This can be avoided either by having workpiece 206 be picked up by pickup arm 106, for example by a vacuum pickup and then either moving surface 210 down making room for the leading edge to rotate without touching surface 210 or the arrangement diagrammatically shown in FIG. 9 can be used to avoid having to move surface 210 down. After a full rotation of body 202, workpiece 208 is deposited again onto surface 210. Edge 214 touching surface 210 first and thereafter edge 212 touching surface 210 without having workpiece 208 being pushed into surface 210. In the top plan view of the preferred embodiment of the invention shown in FIG. 5 it can be seen that edge 125 of pickup arm 106 is along the axis of rotatable shaft 102.

Figure 10:
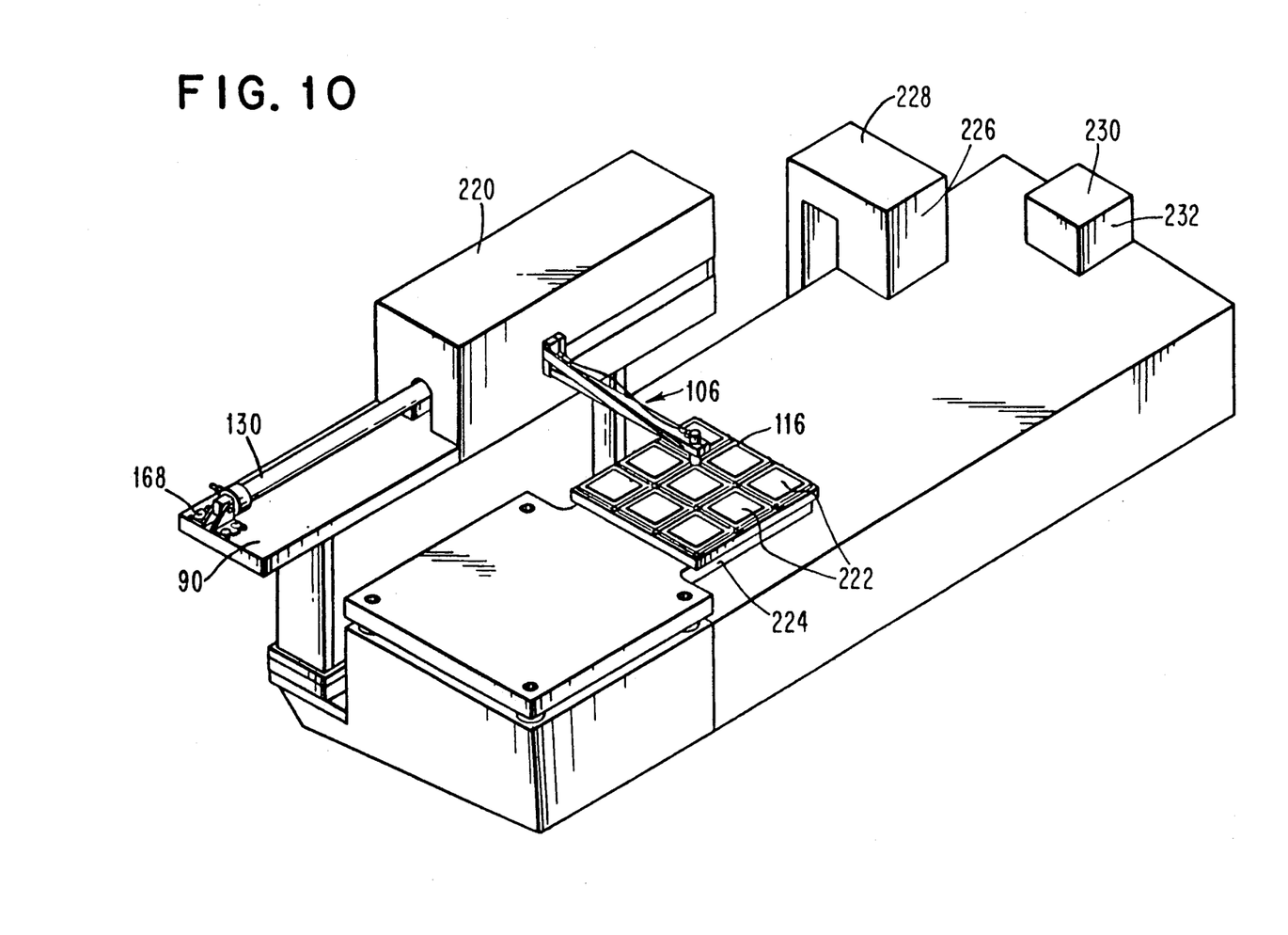
FIG. 10 diagrammatically shows the apparatus of FIG. 4 as part of a semiconductor chip bonding apparatus.

FIG. 10 diagrammatically shows the apparatus of the present invention used in an electronic device bonding tool. Pickup arm 106 extends out from housing 220 which contains most of the elements of the apparatus shown in FIG. 4. Numbers common between FIG. 4 and FIG. 10 represent the same thing. Pickup arm tip 116 picks up an electronic device 222 from an array of devices on a table 224 which is movable in an X and Y direction. On computer control, table 224 orients one of the chips 222 under the pickup arm end 216. Vacuum is activated in pickup arm end 116 by a solenoid valve and gas pressure is activated in pneumatic cylinder 130. If pickup arm 106 advances one-half the circumference of pitch diameter of pinion gear 104, the chip will be in an upwardly facing orientation and can be picked up by a vacuum pickup port 226 shown in phantom in bondhead 228 If pickup arm 206 advances a distance equivalent to the circumference of the pitch diameter of spur gear 104, the chip can be deposited onto surface 230 of bondhead 232. Multiple chip placements can be achieved by using more than one apparatus as shown in FIG. 4. In the situation where the electronic device position is only going to be inverted or where the spur gear advances only one-half the circumference of the pitch diameter, only a semi-circular spur gear 104 need be used. When a semi-circular spur gear is used, pin 148 as shown in FIG. 4 need not be used. Instead an edge along the diameter of the semi-circular spur gear can be pushed up against adjustable stops 154 and 152.

While the invention has been particularly shown and described with reference to the preferred embodiments thereof, it will be understood of those skilled in the art that changes in form and detail may be made therein without departing from the spirit and the scope of the invention.

Having thus described my invention, what I claim as new and desire to secure as Letters Patent is:

1. An apparatus for transferring a work piece from a first predetermined location to a second predetermined location comprising:

a frame;

a member having a substantially cylindrical surface and an axis of rotation, said surface being adapted to roll about said axis and along a surface on said frame, said surface being substantially fixed with respect to said frame;

a work piece pick up means attached to said member;

means for causing said cylindrical surface to roll along said surface on said frame causing said pickup means to move along a substantially curved arc from said first to said second predetermined location;

said pickup means has a first and second end, said first end is attached to said member at a location not on the said portion of said cylindrical surface which rolls along said surface on said frame; and said pickup means has a pickup arm tip location at said second end for picking up said work piece, which is positioned substantially the same distance from said axis of said cylindrical surface as the distance said cylindrical surface is positioned from said axis.

2. The apparatus of claim 1, wherein said pickup means picks up a workpiece by means of a vacuum pickup.

3. The apparatus of claim 1, wherein said apparatus is one of an electronic device transfer device and an electronic device bonding tool.

4. The apparatus of claim 1, wherein said surface on said frame is a plane surface.

5. A method comprising:
providing a work piece; providing a member, having said work piece attached thereto, rotatable about an axis and adapted to roll along a surface substantially fixed with respect to said frame transferring said work piece from a first predetermined location along a curved arc to a second predetermined location, said work piece being maintained at substantially a constant distance from said axis during said transferring; and
moving said axis of said member with respect to said surface causing said member to rotate about said axis.

6. An apparatus for transferring a work piece from a first predetermined location to a second predetermined location comprising:
a frame;
a member having a substantially cylindrical surface which is adapted to roll along a surface on said frame, said surface substantially fixed with respect to said frame;
said substantially cylindrical surface has an axis of rotation;
a work piece pickup means attached to said member;
means for causing said cylindrical surface to roll along said surface on said frame causing said pickup means to move along a curved arc from said first to said second location; and
said pickup means having an arm having a first end and a second end, said first end being attached to said member, at said second end there being a pickup tip surface, said pickup surface having an edge lying along a radial direction from the axis of said cylindrical surface, said edge being a substantially fixed distance from said axis during the operation of said apparatus.

7. An apparatus for transferring a work piece from a first predetermined location to a second predetermined location comprising:
a frame;
a member having a substantially cylindrical surface which is adapted to roll along a surface on said frame, said surface being substantially fixed with respect to said frame;
a work piece pick up means attached to said member;
means for causing said cylindrical surface to roll along said surface on said frame causing said pickup means to move along a substantially curved arc from said first to said second predetermined location;
said pickup means has a first and second end, said first end is attached to said member at a location not on the said portion of said cylindrical surface which rolls along said surface on said frame; and
said pickup means has a pickup arm tip location at said second end for picking up said work piece, which is positioned substantially the same distance from said axis of said cylindrical surface during the operation of said apparatus.

* * * * *